(12) United States Patent
Umstadter

(10) Patent No.: US 9,155,180 B1
(45) Date of Patent: Oct. 6, 2015

(54) SYSTEM AND METHOD OF SIMULTANEOUSLY FUELING AND MITIGATING DEBRIS FOR A PLASMA-BASED ILLUMINATION SOURCE

(71) Applicant: KLA-Tencor Corporation, Milpitas, CA (US)

(72) Inventor: Karl R. Umstadter, Livermore, CA (US)

(73) Assignee: KLA-Tencor Corporation, Milpitas, CA (US)

(*) Notice: Subject to any disclaimer, the term of this patent is extended or adjusted under 35 U.S.C. 154(b) by 438 days.

(21) Appl. No.: 13/647,826

(22) Filed: Oct. 9, 2012

Related U.S. Application Data

(60) Provisional application No. 61/545,500, filed on Oct. 10, 2011.

(51) Int. Cl.
| | |
|---|---|
| *H05H 1/00* | (2006.01) |
| *H01J 27/08* | (2006.01) |
| *G03F 7/20* | (2006.01) |
| *H01J 17/30* | (2006.01) |

(52) U.S. Cl.
CPC ............. *H05H 1/00* (2013.01); *G03F 7/70916* (2013.01); *H01J 17/30* (2013.01); *H01J 27/08* (2013.01)

(58) Field of Classification Search
CPC ............ H05H 1/00; H05J 15/00; H05J 15/02; H05J 17/30; H05J 27/08; H05J 17/16; H05J 49/10; G03F 7/70033; G03F 7/70; G03F 7/70908; G03F 7/70916
See application file for complete search history.

(56) References Cited

U.S. PATENT DOCUMENTS

| | | | | |
|---|---|---|---|---|
| 4,893,470 | A  * | 1/1990  | Chang | 60/204 |
| 6,421,421 | B1 * | 7/2002  | McGeoch | 378/119 |
| 6,614,505 | B2 * | 9/2003  | Koster et al. | 355/30 |
| 7,199,384 | B2   | 4/2007  | Smith et al. | |
| 7,368,741 | B2 * | 5/2008  | Melnychuk et al. | 250/504 R |
| 7,755,070 | B2   | 7/2010  | De Bruijn et al. | |
| 8,916,834 | B2 * | 12/2014 | Lane | 250/423 R |
| 2011/0315867 | A1 * | 12/2011 | Lane | 250/282 |
| 2015/0102239 | A1 * | 4/2015  | Yanagida et al. | 250/504 R |

* cited by examiner

*Primary Examiner* — Jung Kim
(74) *Attorney, Agent, or Firm* — Suiter Swantz pc llo

(57) ABSTRACT

The disclosure is directed to a system and method of fueling and mitigating debris for an illumination source. An illumination system may include a plasma-based illumination source. The illumination system may provide illumination along an illumination path emanating from an illumination origin of the illumination source. A gas jet nozzle may be disposed at a selected distance from the illumination origin or proximate to the illumination origin. The gas jet nozzle may be configured to provide fuel gas to fuel the plasma-based illumination source. The gas jet nozzle may be further configured to provide fuel gas in a selected direction substantially opposite to a direction of illumination emanating from the illumination origin to remove at least a portion of debris from the illumination path.

29 Claims, 5 Drawing Sheets

SYSTEM AND METHOD OF SIMULTANEOUSLY FUELING AND MITIGATING DEBRIS FOR A PLASMA-BASED ILLUMINATION SOURCE

PRIORITY

The present application claims priority to U.S. Provisional Application Ser. No. 61/545,500, entitled SIMULTANEOUSLY FUELED AND MITIGATED DISCHARGE PRODUCED PLASMA SOURCE, By Karl R. Umstadter, filed Oct. 10, 2011.

TECHNICAL FIELD

The present disclosure generally relates to the field of plasma-based illumination systems and more particularly to a system and method of simultaneously fueling and mitigating debris for a plasma-based illumination source.

BACKGROUND

Illumination systems operating at EUV, DUV, or UV wavelengths, among others, are often desirable for semiconductor inspection and analysis. A material inspection or analysis system may utilize a plasma-based illumination source, such as a discharge produced plasma (DPP) source, to provide illumination at a selected wavelength. Under current methods, a fuel gas may be pumped into a chamber of the plasma-based illumination source to fuel plasma discharge. Illumination resulting from the plasma discharge may emanate from an illumination origin of the plasma-based illumination source along an illumination path.

Illumination transferred along the illumination path may be accompanied by debris, such as ions and particles, emitted from the plasma discharge, which may cause damage and reduce the illumination. Debris may be mitigated by employing additional devices or systems to remove at least a portion of debris from the illumination path. However, additional systems or devices for debris mitigation tend to increase the size and complexity of an illumination system and also tend reduce the overall illumination output. Thus plasma-based illumination sources are often limited to applications that do not require relatively high illumination power.

SUMMARY

The present disclosure is directed to system and method of simultaneously fueling and mitigating debris for a plasma-based illumination source.

In one aspect, the present disclosure is directed to a system of fueling and mitigating debris for an illumination source. The system may include a gas jet nozzle configured to provide fuel gas to a plasma-based illumination source in a selected direction substantially opposite to a direction of illumination emanating from an illumination origin of the plasma-based illumination source along an illumination path. The fuel gas may fuel the plasma-based illumination source and may simultaneously remove at least a portion of debris from the illumination path.

In another aspect, the present disclosure is directed to an illumination system including a plasma-based illumination source and a gas jet nozzle. The plasma-based illumination source may include an illumination origin, wherein the plasma-based illumination source may be configured to provide illumination emanating from the illumination origin along an illumination path. The gas jet nozzle may be configured to provide fuel gas to the plasma-based illumination source in a selected direction substantially opposite to a direction of illumination emanating from the illumination origin along the illumination path. The fuel gas may fuel the plasma-based illumination source and may simultaneously remove at least a portion of debris from the illumination path.

In another aspect, the present disclosure is directed to a method of fueling and mitigating debris for an illumination source including the steps of: providing illumination emanating from an illumination origin of a plasma-based illumination source along an illumination path; fueling the plasma-based illumination source with fuel gas directed from a gas jet nozzle in a selected direction substantially opposite to a direction of illumination emanating from the illumination origin along the illumination path; and removing at least a portion of debris from the illumination path with fuel gas directed from the gas jet nozzle in the selected direction substantially opposite to the direction of illumination emanating from the illumination origin along the illumination path.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
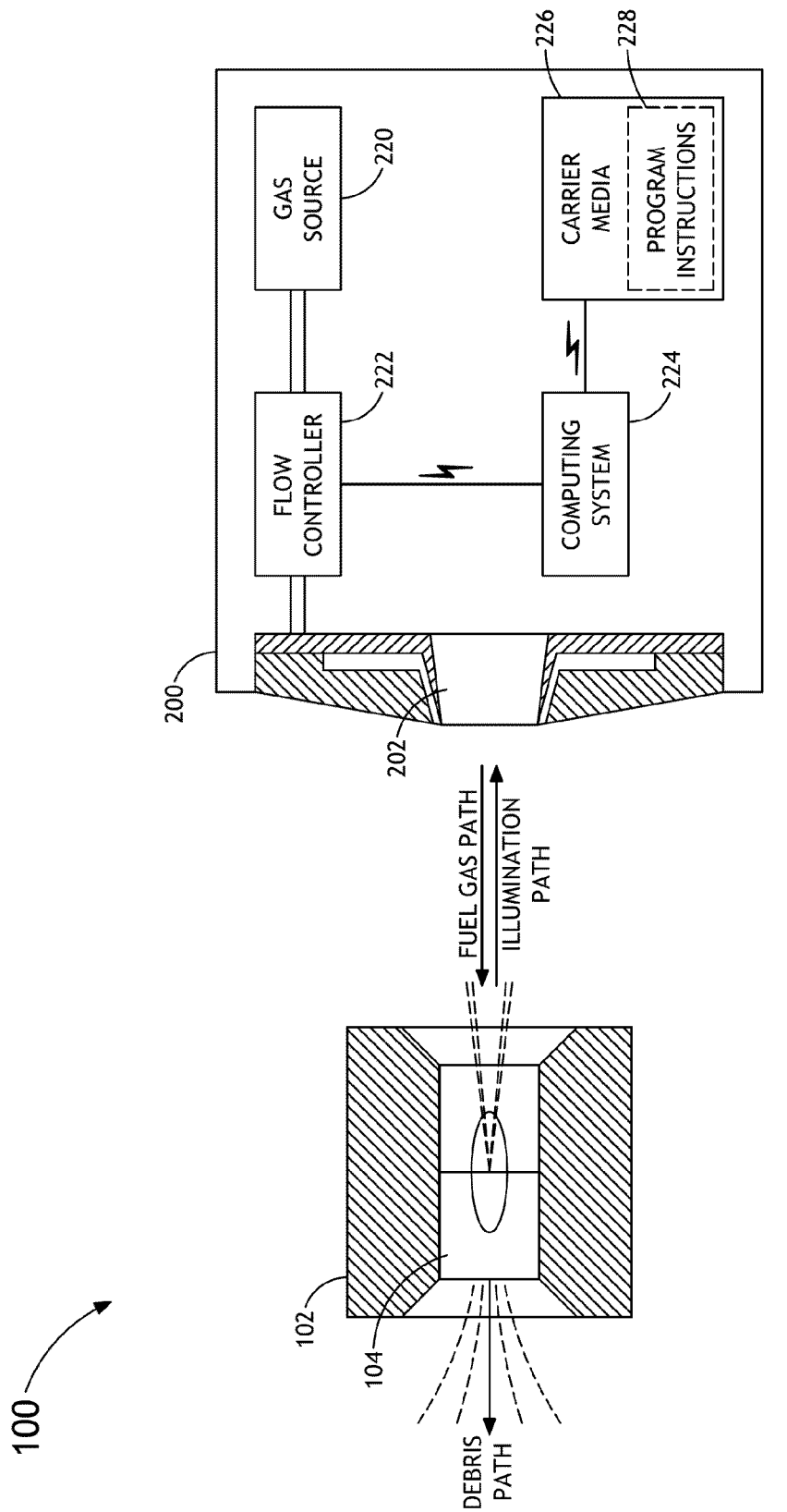
FIG. 1 is a block diagram illustrating an illumination system including an illumination source and fueling and debris mitigation system, in accordance with an embodiment of this disclosure.
Figure 2A:
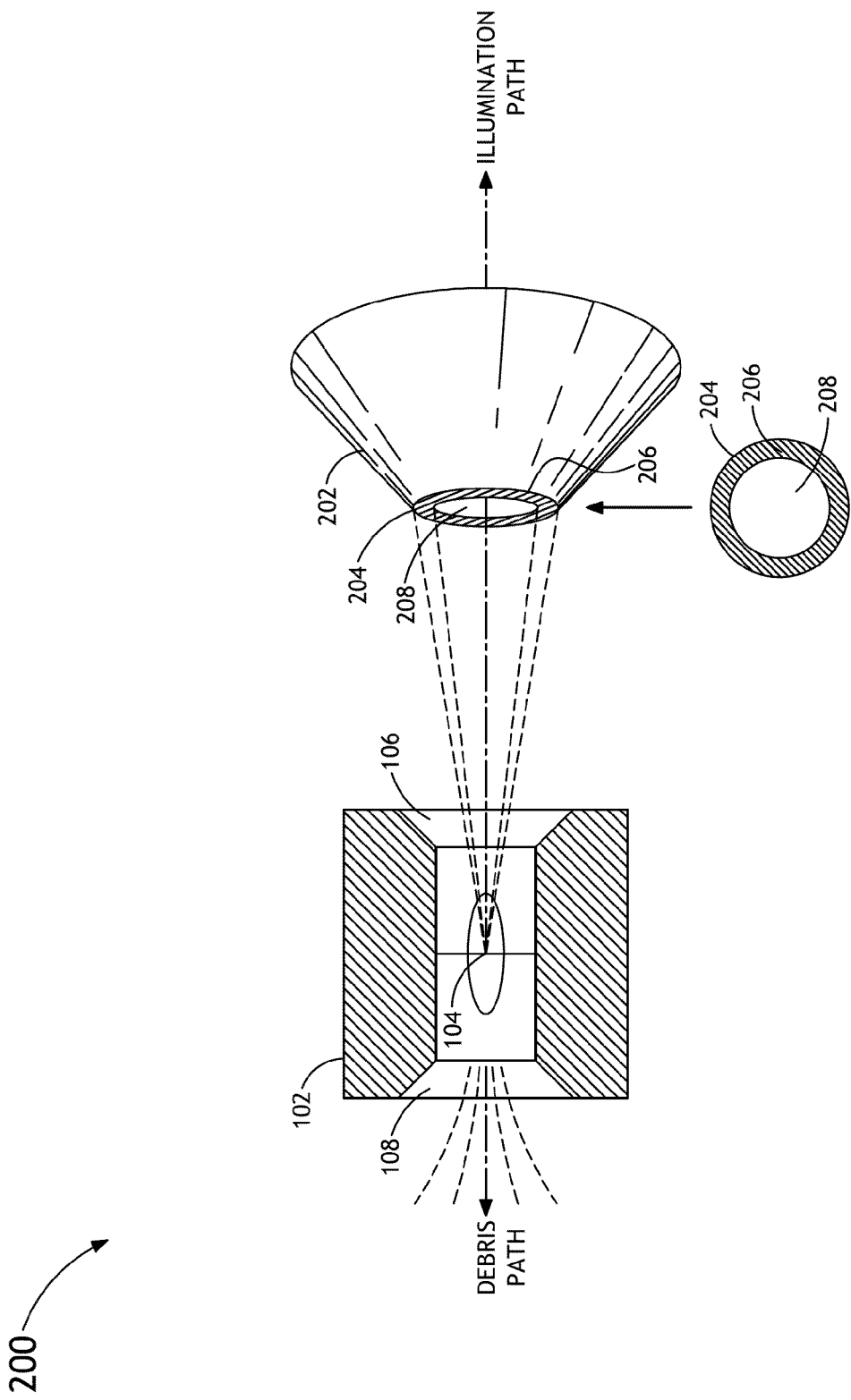
FIG. 2A is a conceptual illustration of a gas jet nozzle of the fueling and debris mitigation system, wherein the gas jet nozzle is configured to direct fuel gas in a selected direction substantially opposite to a direction of illumination emanating from an illumination origin of the illumination source, in accordance with an embodiment of this disclosure.
Figure 2B:
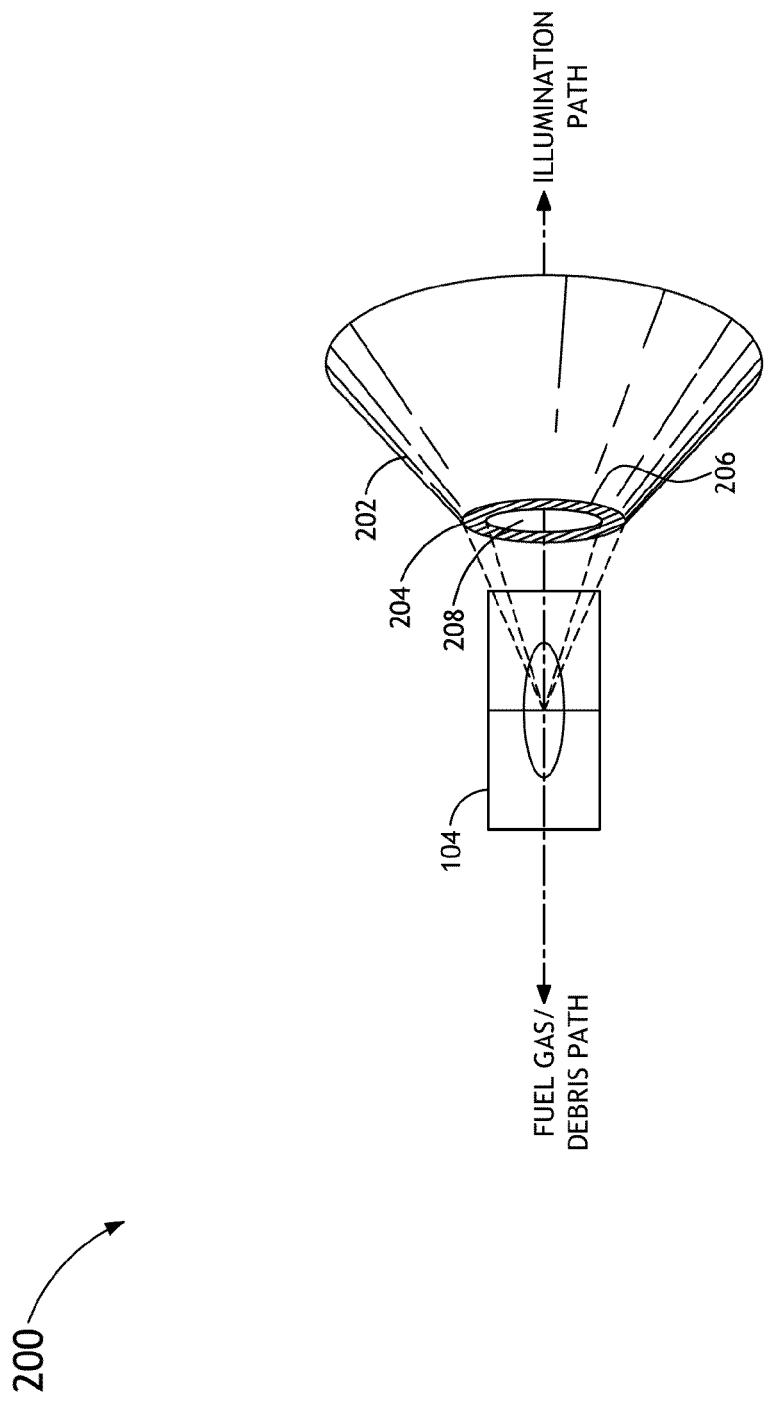
FIG. 2B is a conceptual illustration of the gas jet nozzle of the fueling and debris mitigation system, wherein a fuel delivery aperture of the gas jet nozzle is disposed proximate to the illumination origin of the illumination source, in accordance with an embodiment of this disclosure.
Figure 2C:
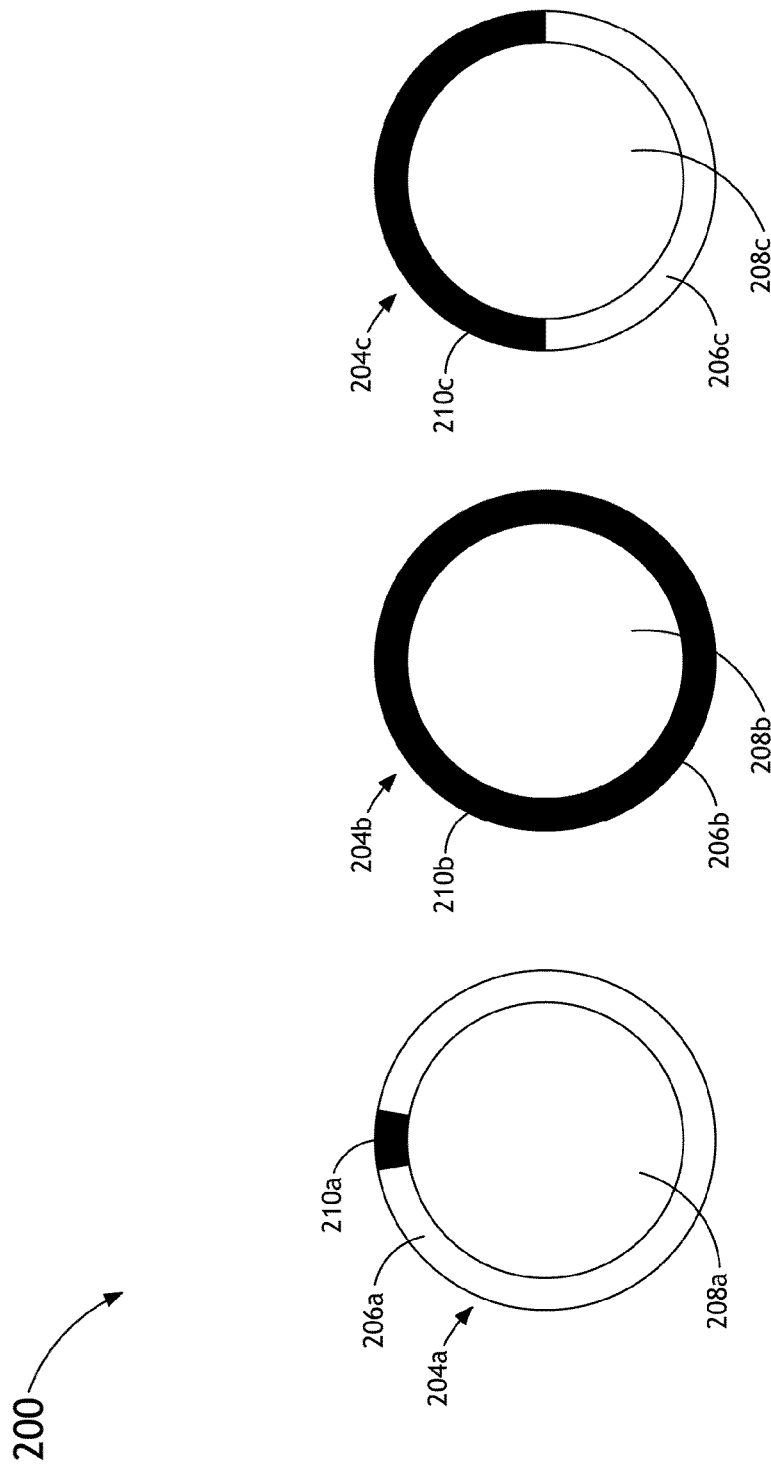
FIG. 2C is a conceptual illustration including frontal views of various embodiments of the gas jet nozzle, wherein the gas jet nozzle includes an annulus with at least one fuel delivery aperture formed along an outer portion of the annulus, in accordance with an embodiment of this disclosure.
Figure 3:
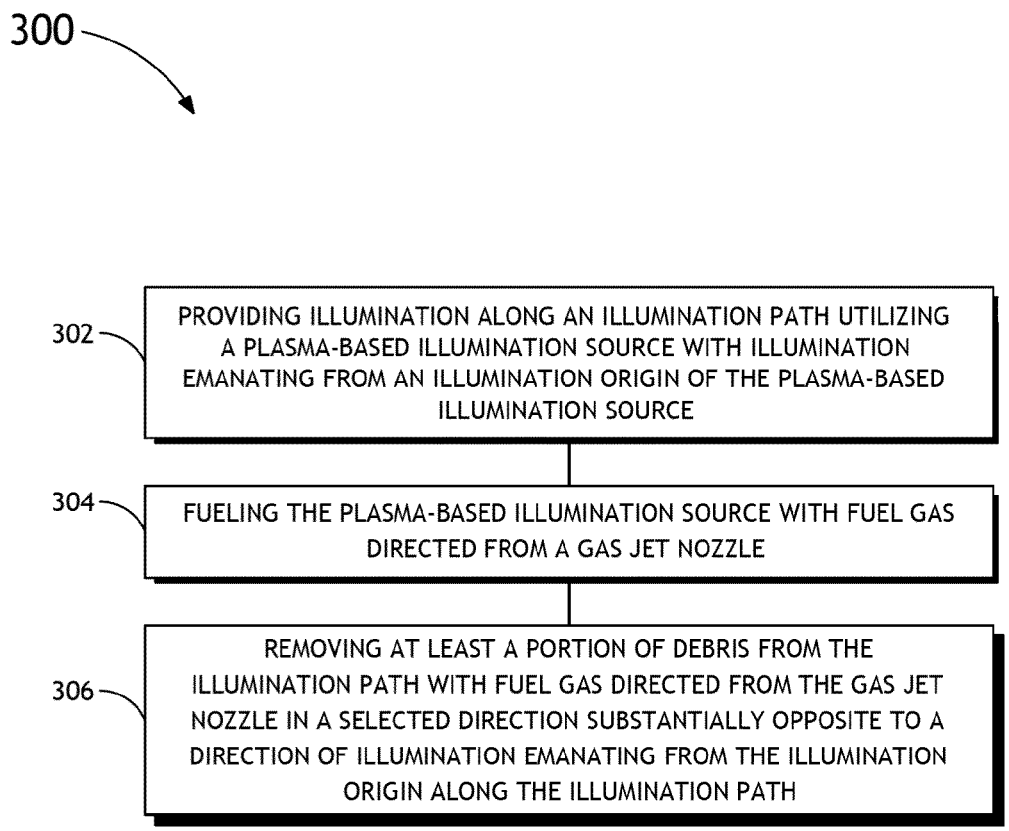
FIG. 3 is a flow diagram illustrating a method of fueling and mitigating debris for an illumination source, in accordance with an embodiment of this disclosure.

FIGS. 1 through 3 generally illustrate a system and method for fueling a plasma-based illumination source (hereinafter "illumination source") and simultaneously mitigating debris emissions from the illumination source. An illumination source, such as a discharge produced plasma (DPP) source, may provide illumination resulting from plasma discharge fueled by a gas or mixture of gases (hereinafter "fuel gas"), such as helium, neon, argon, krypton, xenon, nitrogen, hydrogen, or oxygen, among others. Plasma discharge may result in emission of debris, such as ions and particles, along an illumination path of illumination emanating from an illumination origin of the illumination source. Debris may attenuate illumination by contaminating and damaging surfaces along the illumination path, thereby limiting illumination power and potential applications of the illumination source. The present disclosure is directed to a system and method for removing at least a portion of debris from the illumination path to reduce attenuation utilizing pressurized fuel gas directed in a selected direction substantially opposite to a direction of illumination emanating from the illumination origin of the illumination source. Accordingly, fuel gas may be simultaneously utilized to fuel plasma discharge and to mitigate debris.

FIG. 1 illustrates an illumination system 100 in accordance with an embodiment of this disclosure. The illumination system 100 may include at least one illumination source 102 configured to provide illumination along an illumination path. The illumination path may be delineated by physical structure of the illumination source and/or by one or more optical elements. Illumination resulting from plasma discharge may emanate from an illumination origin 104, such as, but not limited to, a cylindrical bore, curvature, notch, or planar surface, of the illumination source 102. The illumination source 102 may be configured for any plasma discharge protocol known to the art. For example, the illumination source 102 may be electrically coupled to or include at least one energy source configured for applying electrical current across fuel gas to discharge plasma. In one embodiment, the illumination source may be further coupled to or include one or more atmospheric controllers, such as a heating/cooling element or a pressure regulator.

The illumination system 100 may further include a system 200 for fueling and mitigating debris emitted by the illumination source 102. The system 200 may include a gas jet nozzle 202 configured to provide fuel gas to the illumination source 102 to fuel plasma discharge to provide illumination from the illumination origin 104 along the illumination path. In one embodiment, the fuel gas may be heated and/or ionized utilizing any system or method known to the art to achieve plasma discharge. It is noted, however, that in some embodiments the fuel gas may not necessarily be heated or ionized. The system 200 may further include a gas source 220 fluidically coupled to the gas jet nozzle 202. The gas source 220 may include a pressurized container configured to hold fuel gas. The gas source 220 may be further configured to supply fuel gas to the gas jet nozzle 202 at a selected rate. Accordingly, the gas jet nozzle 202 may be configured to deliver fuel gas received from the gas source 220 to the illumination source 102 at a selected rate to fuel plasma discharge causing illumination to emanate from the illumination origin 104 along the illumination path.

In one embodiment, the system 200 may further include a flow controller 222 fluidically coupled to the gas source 220 and the gas jet nozzle 202. The flow controller 222 may be configured to regulate flow of fuel gas from the gas source 220 to the gas jet nozzle 202. The flow controller 222 may be configured to regulate gas flow so that fuel gas is delivered from the gas jet nozzle 202 at the selected rate or at a selected pressure level. The flow controller 222 may include at least one valve or pressure regulator manually or mechanically controlled to adjust the flow of fuel gas passing through at least one conduit from the gas source 220 to the gas jet nozzle 202.

In a further embodiment, the flow controller 222 may be mechanically actuated in response to electrical signals. The system 200 may include a computing system 224 communicatively coupled to the flow controller 222. The computing system 224 may be configured to drive the flow controller 222 by transmitting electrical signals in response to program instructions 228 executed by the computing system 224 from a communicatively coupled carrier media 226. The computing system 224 may be further configured to drive the flow controller 222 in response to user input and/or a predetermined control algorithm to control various flow parameters such as, but not limited to, rate, pressure, or density profile of fuel gas delivered by the gas jet nozzle 202. In one embodiment, the system 200 may further include in-situ diagnostics disposed proximate to the gas jet nozzle 202 to monitor gas flow. The flow controller 222 may be further configured to control gas flow in response to information received from in-situ diagnostics.

The gas jet nozzle 202 may be further configured to direct the fuel gas in a selected direction to remove at least a portion of debris from the illumination path while simultaneously fueling plasma discharge. The selected direction may be any direction against a direction of illumination traveling along the illumination path from the illumination origin 104. For example, the gas jet nozzle 202 may be configured to direct fuel gas in the selected direction substantially opposite to the direction of illumination emanating from the illumination origin 104. At least a portion of debris may be removed from the illumination path and disposed through a debris path flowing away from the illumination origin 104. In one embodiment, the debris path may flow in the same direction as the fuel gas directed at the illumination origin 104.

FIGS. 2A through 2C further illustrate the system 200, showing the relationship between the gas jet nozzle 202 and the illumination source 102 in greater detail. Referring to FIG. 2A, the gas jet nozzle 202 may be disposed at a selected distance from the illumination source 102. The gas jet nozzle 202 may be configured to provide fuel gas to the illumination source 102 through an illumination port 106 of the illumination source 102. Accordingly, fuel gas provided by the gas jet nozzle 202 and illumination emanating from the illumination source 102 may be directed substantially opposite to one another. Doing so may allow the fuel gas to remove at least a portion of debris from the illumination path and dispose of the debris along the debris path flowing through an exhaust port 108 of the illumination source 102 in a direction oriented substantially opposite (e.g. approximately 180 degrees) from the direction of illumination emanating from the illumination origin 104. However, it is noted herein that the selected direction need not be completely opposite to (e.g. 180 degrees) from the direction of illumination. It is contemplated that any selected direction opposing the direction of illumination may allow for removal of debris from the illumination path.

In one embodiment, the gas jet nozzle 202 may be further integrated with a differential pumping aperture (DPA) configured for separating high pressure and low pressure regions. In another embodiment (see FIG. 2B), the gas jet nozzle 202 may be disposed proximate to the illumination origin 104 of the illumination source 102 allowing the gas jet nozzle 202 to provide fuel gas along a shorter fuel gas delivery path. In yet another embodiment, the gas jet nozzle 202 may be disposed proximate to the illumination origin 104 at the end of a conduit running along an inner wall of the illumination source 102. Disposing the gas jet nozzle 202 proximate to the illumination origin 104 may further allow for a relatively smaller region of fueling pressure, thereby increasing power of illumination (i.e. more photons) transferred along the illumination path. In one embodiment, that gas jet nozzle 202 may be further integrated with the illumination source 102 to allow for proximate disposition of the gas jet nozzle 202 as compared with the illumination origin 104 of the illumination source 102.

As illustrated in FIGS. 2A through 2C, the gas jet nozzle 202 may include an annulus 204 disposed at the tip of the gas jet nozzle 202. The annulus 204 may include an outer portion 206 having at least one aperture 210 configured for providing gas fuel received by the gas jet nozzle 202 from the gas source 220. In one embodiment, illumination emanating from the illumination origin 104 of the illumination source 102 along the illumination path may travel through a central portion 208 of the annulus 204 while fuel gas provided through the aperture 210 is directed in the selected direction substantially opposite to the direction of illumination. It is further contemplated that the gas jet nozzle 202 may include structures having alternative geometries (e.g. elliptical, semi-circular, rectangular, etc.) configured for providing fuel gas through an aperture 210. Furthermore, in some embodiments, the gas jet nozzle 202 may include a geometry lacking a central portion 208 configured to receive illumination. Accordingly, any description of the annulus 204 provided herein should be understood to encompass alternative geometries unless otherwise noted.

FIG. 2C illustrates the annulus 204 of the gas jet nozzle 202 in accordance with various embodiments of the present disclosure. In one embodiment, the annulus 204a may include at least one aperture 210a disposed along an outer portion 206a of the annulus 204a. In a further embodiment, the annulus 204 may include a plurality of apertures 210 disposed along the outer portion 206. The plurality of apertures 210 may be further distributed uniformly along the outer portion 206 of the annulus 204. In another embodiment, the annulus 204b may include a continuous aperture 210b extending along a substantial entirety of the outer portion 206b of the annulus 204b. Alternatively, the annulus 204c may include a continuous aperture 210c extending along a selected portion of the outer portion 206c of the annulus 204c. For example, the annulus 204c may include at least one continuous aperture 210c extending along a quadrant or hemisphere of the outer portion 206c of the annulus 204c. Various implementations may require an alternative number, disposition, and/or size of one or more apertures 210 of the outer portion 206 of the annulus 204. The foregoing examples are, therefore, included for illustrative purposes only and should not be construed as limitations of the present disclosure.

In one embodiment, the illumination system 100 described above may be configured for material inspection or analysis including, but not limited to, inspection systems described in U.S. Pat. No. 7,548,308, U.S. Pat. No. 6,271,916, and U.S. Pat. No. 6,201,601, all incorporation herein by reference. For example, the illumination system 100 may be configured for inspecting semi-conductor wafers or semi-conductor production masks. The illumination system 100 may be configured for any inspection system, analysis technique or method known to the art, not necessarily limited to inspection of semi-conductor devices.

FIG. 3 illustrates a method 300 of simultaneously fueling and mitigating debris for an illumination source 102 in accordance with systems 100 and 200. However, one or more steps of method 300 may be executed by alternative systems or devices known to the art. Therefore method 300 should not be limited to systems 100 and 200. At step 302, the method 300 may include providing illumination along an illumination path emanating from the illumination origin 104 of the illumination source 102. Illumination emanating from the illumination origin 104 may result from plasma discharge. However, plasma discharge may further result in debris released along the illumination path.

At steps 304 and 306, the method 300 may include simultaneous fueling and debris mitigation utilizing pressurized fuel gas from a fuel delivery device, such as the gas jet nozzle 202. At step 304, fuel gas may be delivered at a selected distance from the illumination origin 104. In one embodiment, the selected distance may include a location proximate to the illumination origin 104 allowing for a shorter delivery path and a minimized region of fueling pressure. At step 306, fuel gas may be directed in a selected direction substantially opposite to a direction of illumination emanating from the illumination origin 104 along the illumination path. The fuel gas may be delivered at a selected rate, pressure, and/or density profile to remove at least a portion of debris from the illumination path. The debris may be disposed of via a debris path flowing away from the illumination origin 104 in a direction substantially opposite from the direction of illumination traveling along the illumination path. Accordingly, the illumination source 102 may be fueled while at least a portion of debris is simultaneously removed from the illumination path.

It is further contemplated that each of the embodiments of the method described above may include any other step(s) of any other method(s) described herein. In addition, each of the embodiments of the method described above may be performed by any of the systems described herein.

It should be recognized that the various steps described throughout the present disclosure may be carried out by a single computing system or, alternatively, a multiple computing system. Moreover, different subsystems of the system may include a computing system suitable for carrying out at least a portion of the steps described above. Therefore, the above description should not be interpreted as a limitation on the present invention but merely an illustration. Further, the one or more computing systems may be configured to perform any other step(s) of any of the method embodiments described herein.

The computing system may include, but is not limited to, a personal computing system, mainframe computing system, workstation, image computer, parallel processor, or any other device known in the art. In general, the term "computing system" may be broadly defined to encompass any device having one or more processors, which execute instructions from a memory medium.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. Program instructions implementing methods such as those described herein may be transmitted over or stored on carrier medium. The carrier medium may be a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. A system of fueling and mitigating debris for an illumination source, comprising:
   a gas jet nozzle configured to provide fuel gas to a plasma-based illumination source in a selected direction substantially opposite to a direction of illumination emanating from an illumination origin of the plasma-based illumination source along an illumination path, wherein fuel gas fuels the plasma-based illumination source and removes at least a portion of debris from the illumination path.

2. The system of claim 1, wherein the gas jet nozzle includes an annulus configured to receive illumination from the illumination path through a central portion of the annulus, wherein the gas jet nozzle is further configured to provide fuel gas through at least one aperture along an outer portion of the annulus.

3. The system of claim 2, wherein the at least one aperture includes a continuous aperture substantially formed along an entirety of the outer portion of the annulus.

4. The system of claim 2, wherein the at least one aperture includes a continuous aperture substantially formed along a hemisphere of the outer portion of the annulus.

5. The system of claim 2, wherein the at least one aperture is disposed proximate to the illumination origin of the plasma-based illumination source.

6. The system of claim 1, wherein the fuel gas includes at least one of:
   a heated gas or an ionized gas.

7. The system of claim 1, wherein the fuel gas includes a mixture of gases.

8. The system of claim 1, wherein the fuel gas is associated with a selected wavelength of illumination.

9. The system of claim 1, wherein the fuel gas includes at least one of:
   helium, neon, argon, krypton, xenon, nitrogen, hydrogen, or oxygen.

10. An illumination system, comprising:
    a plasma-based illumination source including an illumination origin, the plasma-based illumination source configured to provide illumination emanating from the illumination origin along an illumination path;
    a gas jet nozzle configured to provide fuel gas to the plasma-based illumination source in a selected direction substantially opposite to a direction of illumination emanating from the illumination origin along the illumination path, wherein fuel gas fuels the plasma-based illumination source and removes at least a portion of debris from the illumination path.

11. The system of claim 10, wherein the gas jet nozzle includes an annulus configured to receive illumination from the illumination path through a central portion of the annulus, wherein the gas jet nozzle is further configured to provide fuel gas through at least one aperture along an outer portion of the annulus.

12. The system of claim 11, wherein the at least one aperture includes a continuous aperture substantially formed along an entirety of the outer portion of the annulus.

13. The system of claim 11, wherein the at least one aperture includes a continuous aperture substantially formed along a hemisphere of the outer portion of the annulus.

14. The system of claim 11, wherein the at least one aperture is disposed proximate to the illumination origin of the plasma-based illumination source.

15. The system of claim 10, wherein the fuel gas includes at least one of:
    a heated gas or an ionized gas.

16. The system of claim 10, wherein the fuel gas includes a mixture of gases.

17. The system of claim 10, wherein the fuel gas is associated with a selected wavelength of illumination.

18. The system of claim 10, wherein the fuel gas includes at least one of:
    helium, neon, argon, krypton, xenon, nitrogen, hydrogen, or oxygen.

19. The system of claim 10, wherein the illumination system is configured for material inspection or analysis.

20. The system of claim 19, wherein the illumination system is configured for inspecting at least one of:
    a semiconductor wafer or a semiconductor production mask.

21. A method of fueling and mitigating debris for an illumination source, comprising:
    providing illumination emanating from an illumination origin of a plasma-based illumination source along an illumination path;
    fueling the plasma-based illumination source with fuel gas directed from a gas jet nozzle in a selected direction substantially opposite to a direction of illumination emanating from the illumination origin along the illumination path; and
    removing at least a portion of debris from the illumination path with fuel gas directed from the gas jet nozzle in the selected direction substantially opposite to the direction of illumination emanating from the illumination origin along the illumination path.

22. The method of claim 21, wherein the method further includes:
    receiving illumination from the illumination path through a central portion of an annulus of the gas jet nozzle; and
    providing fuel gas through at least one aperture along an outer portion of the annulus.

23. The method of claim 22, wherein the at least one aperture includes a continuous aperture substantially formed along an entirety of the outer portion of the annulus.

24. The method of claim 22, wherein the at least one aperture includes a continuous aperture substantially formed along a hemisphere of the outer portion of the annulus.

25. The method of claim 22, wherein the at least one aperture is disposed proximate to the illumination origin of the plasma-based illumination source.

26. The method of claim 21, wherein the fuel gas includes at least one of:
    a heated gas or an ionized gas.

27. The method of claim 21, wherein the fuel gas includes a mixture of gases.

28. The method of claim 21, wherein the fuel gas is associated with a selected wavelength of illumination.

29. The method of claim 21, wherein the fuel gas includes at least one of:
helium, neon, argon, krypton, xenon, nitrogen, hydrogen, or oxygen.

\* \* \* \* \*